(12) United States Patent
Huang et al.

(10) Patent No.: US 8,288,238 B2
(45) Date of Patent: Oct. 16, 2012

(54) METHOD FOR FABRICATING A TUNNELING FIELD-EFFECT TRANSISTOR

(75) Inventors: Ru Huang, Beijing (CN); Yujie Ai, Beijing (CN); Zhihua Hao, Beijing (CN); Chunhui Fan, Beijing (CN); Shuangshuang Pu, Beijing (CN); Runsheng Wang, Beijing (CN); Quanxin Yun, Beijing (CN)

(73) Assignee: Peking University, Beijing (CN)

( * ) Notice: Subject to any disclaimer, the term of this patent is extended or adjusted under 35 U.S.C. 154(b) by 20 days.

(21) Appl. No.: 13/133,643

(22) PCT Filed: Sep. 25, 2010

(86) PCT No.: PCT/CN2010/077249
§ 371 (c)(1),
(2), (4) Date: Jun. 8, 2011

(87) PCT Pub. No.: WO2011/088687
PCT Pub. Date: Jul. 28, 2011

(65) Prior Publication Data
US 2012/0115297 A1 May 10, 2012

(30) Foreign Application Priority Data
Jan. 22, 2010 (CN) .......................... 2010 1 0100144

(51) Int. Cl.
*H01L 21/336* (2006.01)
(52) U.S. Cl. ............................... 438/305; 257/E21.619

(58) Field of Classification Search .................. 438/288, 438/305, 306, 692; 257/E21.619
See application file for complete search history.

(56) References Cited

U.S. PATENT DOCUMENTS

| | | | |
|---|---|---|---|
| 5,929,502 A | 7/1999 | Beasom | |
| 2005/0274992 A1 | 12/2005 | Appenzeller et al. | |
| 2008/0200001 A1* | 8/2008 | Clavelier et al. | 438/305 |
| 2011/0315960 A1* | 12/2011 | Goel et al. | 257/24 |
| 2012/0193679 A1* | 8/2012 | Chen et al. | 257/192 |

* cited by examiner

*Primary Examiner* — William D Coleman
(74) *Attorney, Agent, or Firm* — Maschoff Gilmore & Isrealsen

(57) ABSTRACT

The present invention discloses a method for self-alignedly fabricating tunneling field-effect transistor (TFET) based on planar process, thereby lowering requirements on a photolithography process for fabricating the planar TFET. In the method, the source region and the drain region of the TFET are not directly defined by photolithography; rather, they are defined by another dielectric film which locates over an active region and on both sides of the gate and which is different from the dielectric film that defines the channel region. The influence due to the alignment deviation among three times of photolithography process for defining the channel region, the source and the drain regions may be eliminated by selectively removing the dielectric film over the source and drain regions by wet etching. Therefore, a planar TFET may be fabricated self-alignedly based on this process, thereby the rigid requirements on the alignment deviation of the photolithography during the fabrication procedure of a planar TFET is alleviated, which facilitates to fabricate a planar TFET device with stable and reliable characteristics.

10 Claims, 5 Drawing Sheets

METHOD FOR FABRICATING A TUNNELING FIELD-EFFECT TRANSISTOR

FIELD OF THE INVENTION

The present invention relates to a process for fabricating a semiconductor device, and in particular, to a method for fabricating a tunneling field-effect transistor (TFET).

BACKGROUND OF THE INVENTION

Ultra-large scale integrated circuits technology has been driven by the scaling down of CMOS device to improve the performance, as well as to reduce the cost. However, when the device dimension entered the sub-100 nm regime, the impact of short channel effects such as drain-induced barrier lowering (DIBL), shift of threshold voltage, off-state leakage current increasing and sub-threshold slope (SS) degradation are becoming more and more severe, which restricts the device dimension from further downscaling. Besides adopting novel device structures and new materials, the impact of the short channel effects of the MOSFET can be reduced by changing the operating mechanism of field effect transistor, for example, by employing a tunneling field-effect transistor (TFET).

The TFET is essentially a gate controlled reverse-biased PIN diode. FIG. 1 shows a sectional view of a typical TFET along the channel direction. As different from a conventional MOSFET, doping types of source and drain regions of the TFET are different, wherein the drain end is $N^+$-doped and a positive bias voltage is applied thereto during operation, whereas the source end is $P^+$-doped and a negative bias voltage is applied thereto during operation. The operating principle of the TFET will be briefly described as follows by taking an N-type TFET as an example. In off-state, as shown in FIG. 2, the barrier layer between the source and the drain is very thick, thus the electron tunneling can not occur. At this time, the device is a reverse-biased PIN junction, hence the source-drain punch through effect in the conventional CMOS device can not happen, and the leakage current is small. Therefore, TFET is applicable for low power consumption applications. In on-state, as shown in FIG. 3, a positive voltage is applied to the gate and the electric potential in the channel region is lowered, thus the thickness of barrier layer between the source region and the channel region is reduced, therefore, electrons can tunnel through the source end to the channel region and then drift to the drain end. In comparison with the conventional MOSFET, the TFET can obtain a smaller sub-threshold slope (SS), which makes it applicable for low power consumption applications. The reasons are as follows: the source injection of the conventional MOSFET is based on a diffusing-drifting mechanism, and a Fermi-Dirac distribution of carriers makes the SS proportional to the thermoelectric potential kT/q, wherein a minimum possible value of the SS at room temperature is 60 mV/dec; while the source injection of the TFET is based on a tunneling mechanism, thus the SS no longer relies on the restriction of the thermoelectric potential kT/q. It has been indicated by a theoretical calculation that the SS of the TFET can be smaller than 60 mv/dec (See Q. Zhang. et al. IEEE Electron Device Lett., vol. 27, pp. 297-300, 2006.). It has been verified by W. Choi, et al. for the first time, through experiments, that a sub-threshold slope smaller than 60 mv/dec can be obtained for a Si TFET at room temperature (See W. Choi, et al. IEEE Electron Device Lett., vol. 28, pp. 743-745, 2007.). Moreover, the TFET can exhibit better short channel immunity than the conventional MOSFET due to the change of carrier injection mechanism in the source region, which facilitates reducing the cost by improving the integration density.

Two times of photolithography process are needed to form the source and the drain regions of TFET due to the different doping types of the source and drain regions. Thus it is very difficult to fabricate TFET based on the self-aligned planar fabrication process of conventional MOSFET. Due to the influence of the alignment deviation, requirements on the photolithography process will be very high when a planar TFET is fabricated by the conventional non-self-aligned process. Particularly, when the device has a short channel length, the unstability of device characteristics caused by the alignment deviation of the photolithography becomes more severe. In order to overcome the alignment problem of TFET, a TFET having a vertical structure can be fabricated, as reported in the document C. Sandow, et al. Solid-State Electronics, vol. 53, pp. 1126-1129, 2009 and in the document Z. X. Chen, et al. IEEE Electron Device Lett., vol. 30, pp. 754-756, JULY 2009. Furthermore, a method for fabricating a TFET based on a self-aligned sidewall process has also reported in document W. Choi, et al. IEEE Electron Device Lett., vol. 28, pp. 743-745, August 2007. However, for a TFET fabricated by the above methods, overlap between the gate region and the source (or drain) region is very large, which may increase the parasitic capacitance and gate leakage; moreover, the compatibility between the TFET having a vertical structure and the existing planar ultra-large scale integrated circuit is poor, which is unfavorable for an integration of the TFET and the traditional planar MOSFET. Therefore, it is necessary to develop a method for self-alignedly fabricating a TFET based on the traditional CMOS planar process.

SUMMARY OF THE INVENTION

It is an object of the present invention to provide a method for self-alignedly fabricating a TFET based on a planar process, which is realized by the following technical solutions:

A method for self-alignedly fabricating a tunneling field-effect transistor based on a planar process, comprising steps of:

1) defining an active region on a substrate by shallow trench isolation, and then growing gate dielectric, depositing polysilicon, and a gate implantation process is carried out with respect to the polysilicon in sequence;

2) depositing a first hard dielectric on the polysilicon layer and then etching the first hard dielectric to define a channel region; then depositing a second hard dielectric, and a chemical mechanical polishing (CMP) process is carried out on the second hard dielectric by using the upper surface of the first hard dielectric as the stop layer;

In this step, the channel region is defined by the first hard dielectric formed over the active region; and a source region and a drain region are defined by the second hard dielectric on both sides of the channel region. The first hard dielectric and the second hard dielectric are made of different materials; this requires a very high wet etching selection ratio between the two kinds of dielectric materials, for example, the different materials may be silicon nitride and silicon oxide. Thus, the dielectric films formed thereof may be selectively etched by different chemical agents.

3) applying photoresist onto the hard mask comprising both the first and second hard dielectrics, and a photolithography process is carried out to define a through hole over a region where a drain region is to be formed; a wet etching process is carried out on the second hard dielectric over the region through the through hole to remove the second hard dielectric over the region and then removing the photoresist;

subsequently, removing the polysilicon over the region by etching; and an n-type ion implantation process is carried out to form the drain region of the device;

4) depositing the second hard dielectric to cover the drain region, and a CMP process is carried out on the second hard dielectric by using the upper surface of the first hard dielectric as the stop layer, thereby forming a hard mask over the drain region to protect the drain region;

5) applying photoresist onto the hard mask comprising both the first and second hard dielectrics; a photolithography process is carried out to define a through hole over a region where a source region is to be formed; a wet etching is carried out on the second hard dielectric over the region through the through hole to remove the second hard dielectric over the region and then removing the photoresist; subsequently, removing the polysilicon layer over the region by etching; and a p-type ion implantation process is carried out to form the source region of the device;

6) depositing the second hard dielectric to cover the source region, and a CMP process is carried out on the second hard dielectric by using the upper surface of the first hard dielectric as the stop layer, thereby forming a hard mask over the source region to protect the source region;

7) an anneal process is carried out to activate the impurities, and finally subsequent procedures are carried out by using conventional CMOS processes for manufacturing a transistor, so that the tunneling field-effect transistor is obtained.

In the step 1) of the above method, a silicon oxide layer may be grown by dry oxygen oxidation to serve as the gate dielectric layer, and polysilicon is deposited on the gate dielectric layer through chemical vapor deposition.

In the above step 2), silicon nitride may be selected as the first hard dielectric, and silicon oxide may be selected as the second hard dielectric, and vice versa. Chemical vapor deposition is generally used as the deposition method of the first and second hard dielectric. Preferably, in this step, the channel region is defined by photolithography and etching the hard mask; after the first hard dielectric is deposited, a layer of photoresist is spin-coated onto the hard mask and photolithography is carried out to define the channel region, then patterns in the photoresist are transferred onto the hard mask through etching, and subsequently the photoresist is removed, wherein the first hard dielectric is etched using an anisotropic dry etching.

In the above steps 3) and 5), if the second hard dielectric is silicon oxide, it may be removed by wet etching using hydrofluoric acid; and the polysilicon may be etched though an anisotropic etching.

In the above steps 4) and 6), chemical vapor deposition is employed to deposit the second hard dielectric; and preferably, a plasma-enhanced chemical vapor deposition (PECVD) is employed to reduce diffusion of impurities during deposition.

Furthermore, a following step may be added between the above steps 6) and 7): removing the first hard dielectric over the channel region by wet etching, and then depositing and planarizing the second hard dielectric over the region, thereby the entire active region is protected by the second hard dielectric.

In the above step 7), the impurities are activated by a rapid thermal processing (RTP) in nitrogen gas. The said subsequent procedures comprise: forming wiring holes for the gate, the source and the drain by photolithography and etching, growing a layer of conductive film, and then photolithography and an etching process are carried out with respect to the conductive film to form electrodes and interconnections, wherein the grown conductive film is usually made of metal material, for example, aluminium, titanium, copper, or the like, or made of stacked layers of a plurality of metal materials, for example, made by growing a layer of titanium and then growing aluminum.

Since the doping types of the source region and the drain region of the tunneling field-effect transistor (TFET) are different, two times of photolithography process are needed in the traditional method for fabricating a planar TFET to define the source region and the drain region of the device, and thus requirements on the photolithography process are very strict in such a non-self-aligned fabrication procedure. However, in the method for self-alignedly fabricating a planar TFET according to the invention, the requirements on the photolithography processes for fabricating a planar TFET may be lowered. In the method of the invention, the source and drain regions of the TFET are not defined by photolithography directly; instead, they are defined by the dielectric films over the active region and on both sides of the gate, and the influence due to the alignment deviation among the three times of photolithography processes for defining the channel region, the source and drain regions may be eliminated by etching the dielectric films over the source and drain regions by wet etching. Therefore, based on this process, a planar TFET can be fabricated self-alignedly, thereby the rigid requirements on the alignment deviation of photolithography during the fabrication procedure of the planar TFET is alleviated, which facilitates to fabricate a planar TFET device with stable and reliable characteristics.

BRIEF DESCRIPTION OF THE DRAWINGS

FIG. 4(a)-4(m) are schematic flow charts showing a process for self-alignedly fabricating a TFET according to the invention, wherein:

Figure 1:
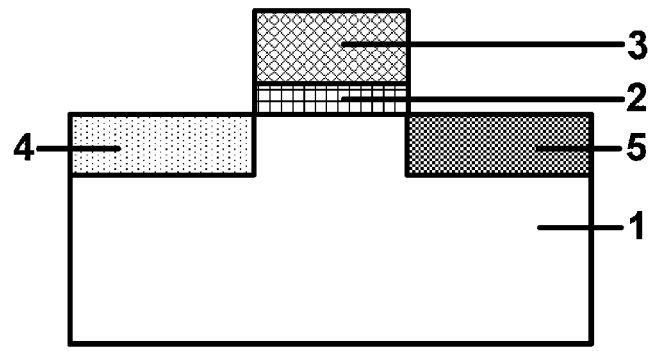
FIG. 1 is a schematic sectional view of a TFET along a channel direction, wherein: '1' denotes substrate; '2' denotes gate dielectric; '3' denotes heavily-doped polysilicon; '4' denotes N$^+$drain region; and '5' denotes P$^+$source region.
Figures 2, 3:
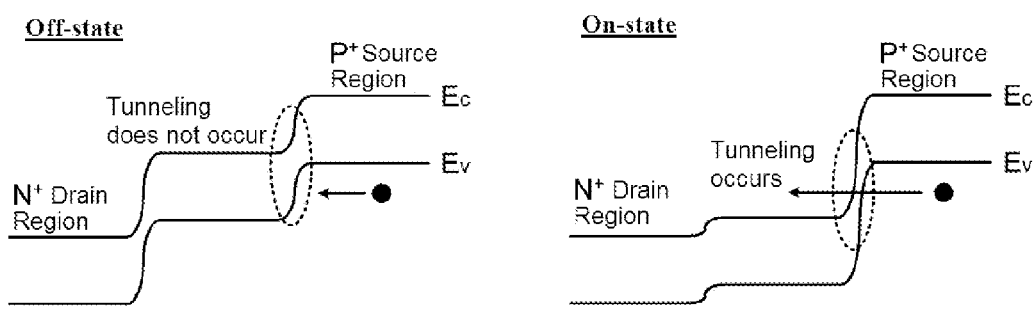
FIG. 2 is a schematic view showing an energy band structure when a TFET is in off-state.
FIG. 3 is a schematic view showing an energy band structure when a TFET is in on-state.
Figure 4A:
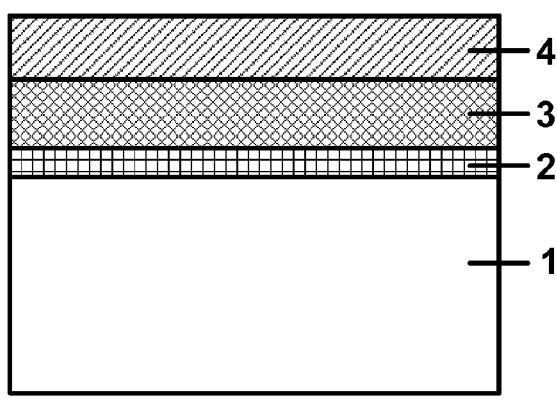
Figure 4B:
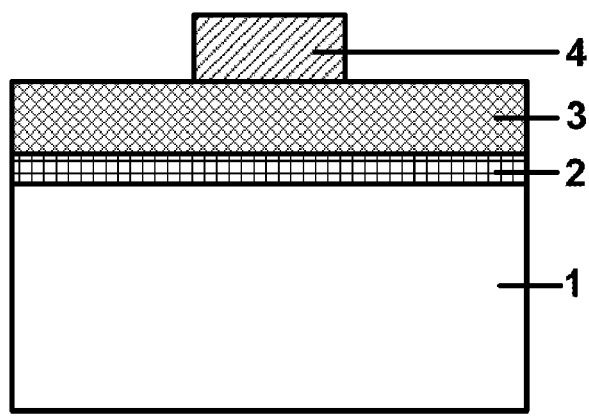
Figure 4C:
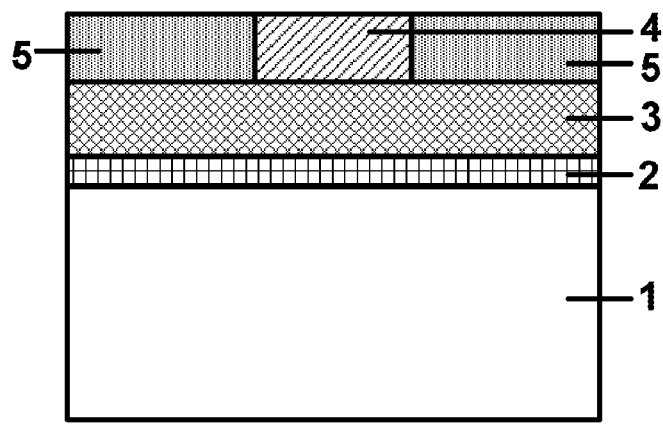
Figure 4D:
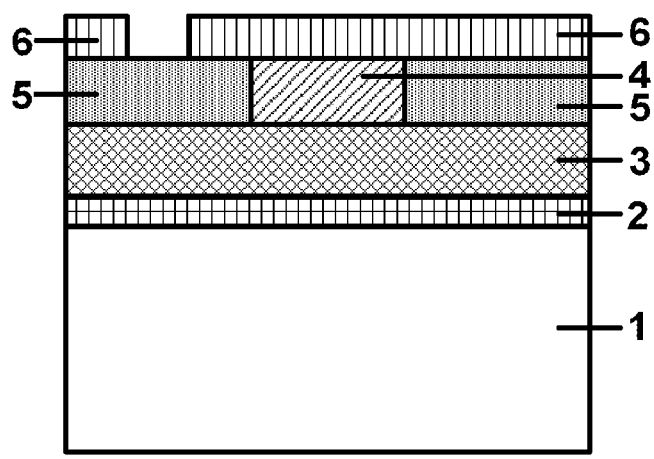
Figure 4E:
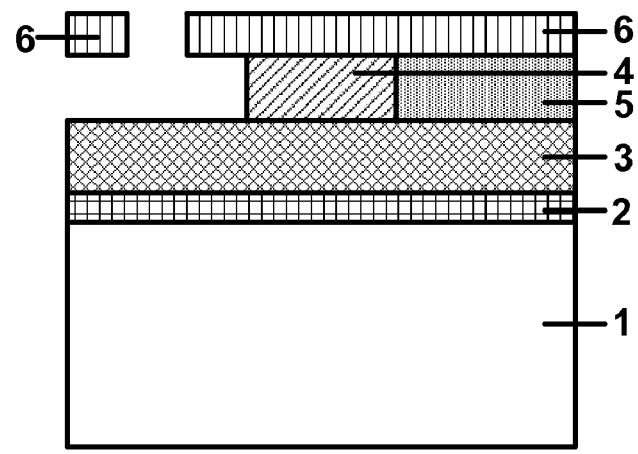
Figure 4F:
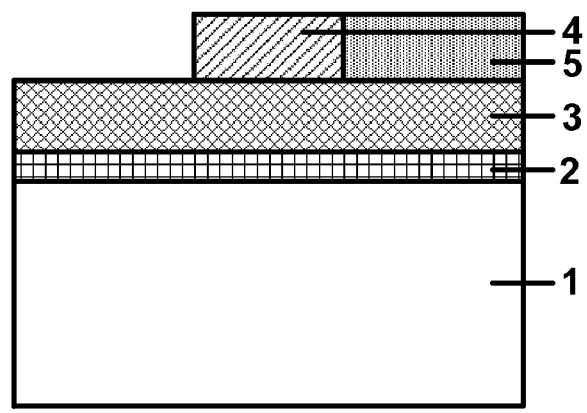
Figure 4G:
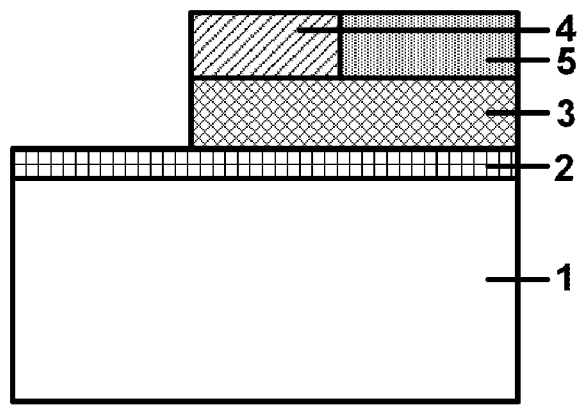
Figure 4H:
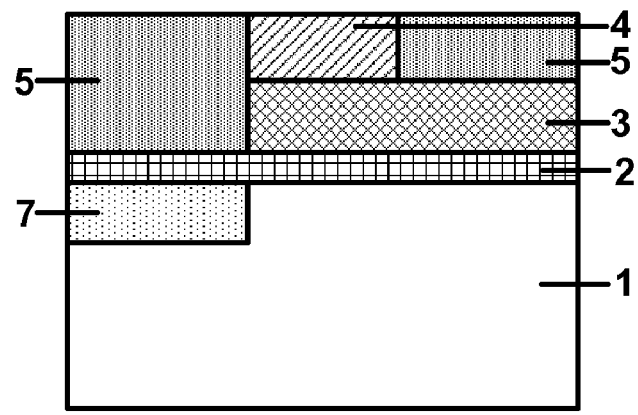
Figure 4I:
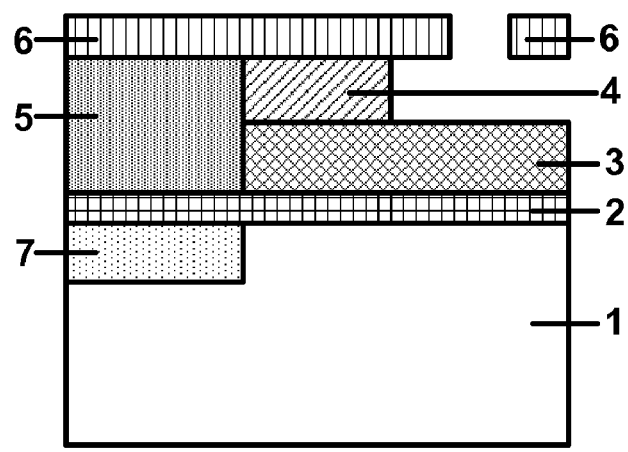
Figure 4J:
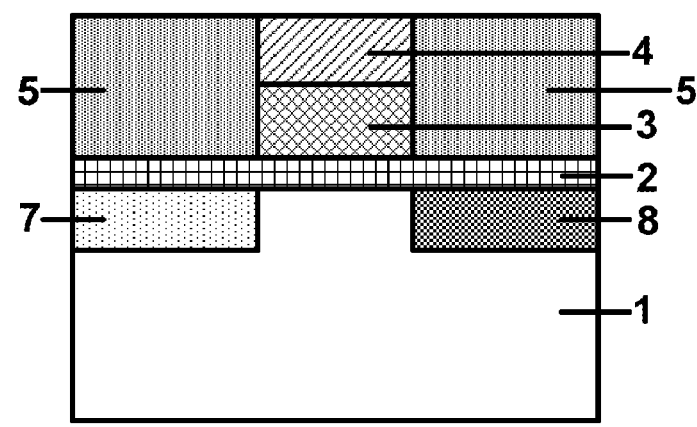
Figure 4K:
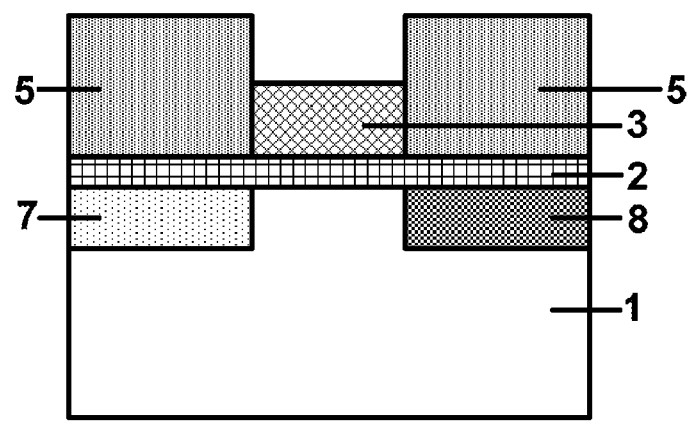
Figure 4L:
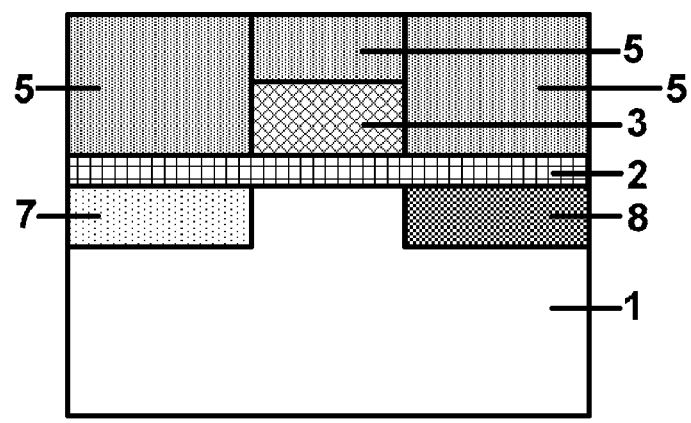
Figure 4M:
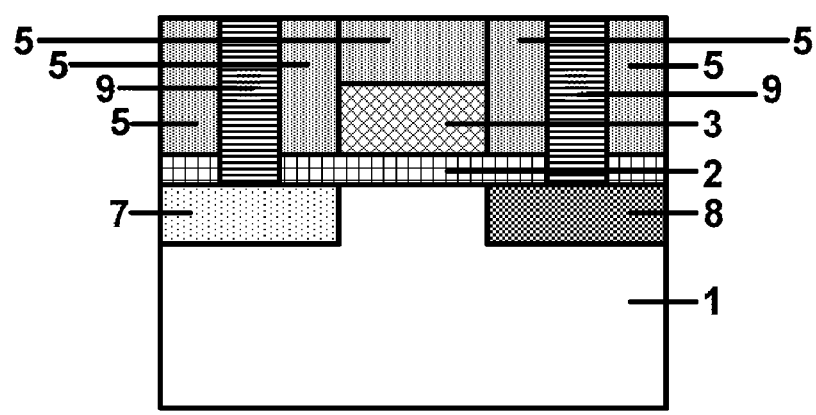

the material for each layer is as follows: '1' denotes bulk silicon substrate; '2' denotes gate dielectric; '3' denotes polysilicon; '4' denotes silicon nitride; '5' denotes silicon oxide; '6' denotes photoresist; '7' denotes N$^+$doped silicon, that is, drain region of a device; '8' denotes P$^+$doped silicon layer, that is, source region of a device; and '9' denotes metal wiring; and the process flow is briefly described as follows:

In FIG. 4(a), on a silicon substrate, a gate dielectric is formed, polysilicon is deposited, a gate implantation is carried out with respect to the polysilicon, and silicon nitride is deposited; in FIG. 4(b), a channel region of a TFET is defined on the silicon nitride; in FIG. 4(c), silicon oxide is deposited, and then a chemical mechanical polishing process (CMP) is carried out on the silicon oxide by using the silicon nitride as the stop layer; in FIG. 4(d), a through hole is defined over a drain region by photolithography; in FIG. 4(e), the silicon oxide over the drain region is removed by wet etching; in FIG. 4(f), the photoresist is removed; in FIG. 4(g), the polysilicon over the drain region is removed by an etching process; in FIG. 4(h), a drain implantation is carried out and silicon oxide is deposited, and then a CMP process is carried out on the silicon oxide by using the silicon nitride as the stop layer; in FIG. 4(i), a through hole is defined over a source region by photolithography, and the silicon oxide over the source region is removed by wet etching; in FIG. 4(j), a source implantation is carried out and silicon oxide is deposited, and then a CMP process is carried out on the silicon oxide by using the silicon nitride as the stop layer; in FIG. 4(k), the silicon nitride over the channel region is removed by wet etching; in FIG. 4(l), silicon oxide is deposited and planarized; and in FIG. 4(m), a self-aligned TFET is finally completed by subsequent procedures.

DETAILED DESCRIPTION OF THE EMBODIMENTS

The invention will be described in detail in conjunction with the drawings and specific embodiments, and a process for self-alignedly fabricating a TFET according to the invention will be provided specifically; however, it is not intended to be interpreted as limiting the scope of the invention in any way.

A tunneling field-effect transistor is fabricated in the following steps:

1) providing a substrate which comprises a bulk silicon substrate, and defining an active region using shallow trench isolation (STI);
2) forming silicon oxide, i.e., a gate dielectric layer, with a thickness of 50 Å, by gate-oxide oxidation;
3) depositing polysilicon with a thickness of 2000 Å on the gate dielectric layer by low pressure chemical vapor deposition (LPCVD);
4) As implantation is carried out with respect to the polysilicon, with an implantation energy of 50 Key and a dosage of $4\times10^{15}$ /m$^2$;
5) depositing silicon nitride with a thickness of 2000 Å on the polysilicon by LPCVD, as shown in FIG. 4(a);
6) applying photoresist on the silicon nitride layer, and defining a channel region of the device by photolithography;
7) etching the silicon nitride by reactive ion etching (RIE) so as to transfer patterns in the photoresist onto the silicon nitride, and then removing the photoresist by a cleaning process, as shown in FIG. 4(b);
8) depositing silicon oxide with a thickness of 2500 Å by LPCVD;
9) a CMP process is carried out on the silicon oxide by using the silicon nitride as the stop layer, as shown in FIG. 4(c);
10) applying photoresist on the silicon nitride and the silicon oxide, and defining a through hole over the drain region by photolithography, as shown in FIG. 4(d);
11) over-etching the silicon oxide over the drain region using hydrofluoric acid, as shown in FIG. 4(e);
12) removing the photoresist by a cleaning process, as shown in FIG. 4(f);
13) etching the polysilicon over the drain region by RIE, as shown in FIG. 4(g);
14) As implantation is carried out on the drain region, with an implantation energy of 10 Key and a dosage of $4\times10^{15}$ /cm$^2$;
15) depositing silicon oxide having a thickness of 4500 Å to cover the drain region by plasma-enhanced chemical vapor deposition (PECVD);
16) a CMP process is carried out on the silicon oxide by using the silicon nitride as the stop layer, as shown in FIG. 4(h);
17) applying photoresist on the silicon nitride and the silicon oxide, and defining a through hole over the source region by photolithography;
18) over-etching the silicon oxide over the source region using hydrofluoric acid, as shown in FIG. 4(i);
19) removing the photoresist by a cleansing process;
20) removing the polysilicon over the source region by RIE;
21) a BF$_2$ implantation is carried out on the source region, with an implantation energy of 10 Kev and a dosage of $3\times10^{15}$ /cm$^2$;
22) depositing silicon oxide with a thickness of 4500 Å to cover the source region by PECVD;
23) a CMP process is carried out on the silicon oxide by using the silicon nitride as the stop layer, as shown in FIG. 4(j);
24) etching the silicon nitride over the channel region by hot concentrated phosphoric acid, as shown in FIG. 4(k);
25) depositing silicon oxide to cover the channel region by PECVD, and then a CMP process is carried out on the silicon oxide, as shown in FIG. 4(l), so as to form a silicon oxide dielectric protecting layer over the entire active region with a maximum thickness of 4000 Å;
26) disposing the deive in nitrogen gas and carrying out a rapid thermal processing (RTP) process at 1050° C. for 5 seconds to activate the impurities;
27) applying photoresist on the silicon oxide dielectric protecting layer, and defining the wiring holes of the device by photolithography;
28) etching the silicon oxide by RIE so as to from the wiring holes;
29) etching off the silicon oxide in the wiring holes using buffered hydrofluoric acid (BHF);
30) removing the photoresist by a cleaning process;
31) sputtering metal titanium and metal aluminum in sequence with a thickness of 700 Å and 1 μm, respectively, so as to form a conductive metal film;
32) applying photoresist on the conductive metal film, and defining metal wirings of the device by photolithography;
33) etching the metal aluminum and the metal titanium in sequence by RIE so as to form wirings;
34) removing the photoresist by a cleaning process;
35) an alloying process is carried out by annealing in N$_2$ and H$_2$ at 430° C. for 30 minutes so as to form the device as shown in FIG. 4(m).

The above embodiments are not intended to limit the scope of the invention. Various modifications and variations may be made by those skilled in the art without departing from the spirit or scope of the invention. Therefore, the protection scope of the invention is defined by the appended claims.

What is claimed is:

1. A method for self-alignedly fabricating a tunneling field-effect transistor based on a planar process, comprising steps of:
   1) defining an active region on a substrate by shallow trench isolation, and then sequentially growing a gate dielectric, depositing polysilicon, and carrying out a gate implantation with respect to the polysilicon;
   2) depositing a first hard dielectric on the polysilicon and then etching the first hard dielectric to define a channel region, and then depositing a second hard dielectric and then a chemical mechanical polishing process is carried out on the second hard dielectric by using the upper surface of the first hard dielectric as the stop layer, wherein the first hard dielectric and the second hard dielectric comprise different materials and are selectively etchable by different chemical agents;
   3) applying photoresist on a mask comprising both the first and second hard dielectric, carrying out photolithography to define a through hole over a region where a drain region is to be formed, carrying out wet etching on the second hard dielectric over the region through the through hole to remove the second hard dielectric over the region, removing the photoresist, removing the polysilicon over the region by etching, and carrying out a n-type ion implantation process to form the drain region of the device;

4) depositing the second hard dielectric to cover the drain region, and carrying out a chemical mechanical polishing process on the second hard dielectric by using the upper surface of the first hard dielectric as the stop layer, thereby forming a hard mask for protecting the drain region;

5) applying a photoresist on a mask comprising both the first and second hard dielectrics, carrying out photolithography to define a through hole over a region where a source region is to be formed, carrying out a wet etching on the second hard dielectric over the region through the through hole to remove the second hard dielectric over the region, removing the photoresist, removing the polysilicon over the region by etching, and carrying out a p-type ion implantation process to form the source region of the device;

6) depositing the second hard dielectric to cover the source region, and carrying out a chemical mechanical polishing process on the second hard dielectric by using the upper surface of the first hard dielectric as the stop layer, thereby forming a hard mask to protect the source region;

7) carrying out an anneal process to activate the impurities, and carrying out subsequent procedures for manufacturing the transistor.

2. The method according to claim 1, wherein the first hard dielectric is silicon nitride and the second hard dielectric is silicon oxide, or the first hard dielectric is silicon oxide and the second hard dielectric is silicon nitride.

3. The method according to claim 1, wherein the first hard dielectric and the second hard dielectric are deposited by chemical vapor deposition.

4. The method according to claim 1, wherein a following step is added between the step 6) and the step 7): removing the first hard dielectric over the channel region by a wet etching, and then depositing and planarizing the second hard dielectric over the region, thereby the entire active region is protected by the second hard dielectric.

5. The method according to claim 1, wherein, in the step 1), silicon oxide is grown as the gate dielectric by dry oxygen oxidation, and the polysilicon is deposited on the gate dielectric by chemical vapor deposition.

6. The method according to claim 1, wherein the step of defining the channel region in the step 2) comprises: depositing the first hard dielectric and applying a layer of photoresist thereon, defining the channel region by photolithography, transferring patterns in the photoresist onto the first hard dielectric by etching, and then removing the photoresist.

7. The method according to claim 1, wherein the first hard dielectric comprises silicon oxide, and in the steps 3) and 5), the second hard dielectric is removed by wet etching using hydrofluoric acid.

8. The method according to claim 1, wherein, in the steps 3) and 5), the polysilicon is etched by anisotropic etching.

9. The method according to claim 1, wherein, in the steps 4) and 6), the second hard dielectric are deposited by plasma-enhanced chemical vapor deposition.

10. The method according to claim 1, wherein, in the step 7), a rapid thermal processing is carried out in nitrogen gas to activate the impurities.

* * * * *

UNITED STATES PATENT AND TRADEMARK OFFICE
CERTIFICATE OF CORRECTION

PATENT NO. : 8,288,238 B2
APPLICATION NO. : 13/133643
DATED : October 16, 2012
INVENTOR(S) : Huang et al.

Page 1 of 1

It is certified that error appears in the above-identified patent and that said Letters Patent is hereby corrected as shown below:

On the Title Page, in Field (74), under "Attorney, Agent, or Firm", in Column 2, Line 2, delete "Isrealsen" and insert -- Israelsen --, therefor.

Signed and Sealed this
Nineteenth Day of February, 2013

Teresa Stanek Rea
*Acting Director of the United States Patent and Trademark Office*